(12) United States Patent
Sinsky et al.

(10) Patent No.: US 7,206,471 B2
(45) Date of Patent: Apr. 17, 2007

(54) INTEGRATED CIRCUIT HAVING AN OPTICAL CORE

(75) Inventors: Jeffrey H. Sinsky, Marlboro, NJ (US); Liming Zhang, Marlboro, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 11/022,178

(22) Filed: Dec. 23, 2004

(65) Prior Publication Data
US 2006/0140533 A1    Jun. 29, 2006

(51) Int. Cl.
*G02B 6/12* (2006.01)
(52) U.S. Cl. .................................................. 385/14
(58) Field of Classification Search ............... None
See application file for complete search history.

(56) References Cited

U.S. PATENT DOCUMENTS

| | | | | |
|---|---|---|---|---|
| 3,295,138 A * | 12/1966 | Nelson | .................. | 342/375 |
| 5,065,207 A | 11/1991 | Heinen | .................. | 357/30 |
| 5,199,087 A | 3/1993 | Frazier | .................. | 385/14 |
| 5,357,121 A | 10/1994 | Miyashita et al. | .............. | 257/79 |
| 5,430,454 A * | 7/1995 | Refregier et al. | .............. | 342/375 |
| 5,515,460 A * | 5/1996 | Stone | .................. | 385/24 |
| 5,589,404 A | 12/1996 | Cunningham et al. | .......... | 437/5 |
| 5,674,778 A | 10/1997 | Lee et al. | .................. | 437/126 |
| 5,682,455 A * | 10/1997 | Kovacic et al. | .............. | 385/131 |
| 5,721,750 A | 2/1998 | Kwon et al. | ............... | 372/44 |
| 6,391,214 B1 | 5/2002 | Kovacic | ..................... | 216/24 |
| 6,396,967 B1 | 5/2002 | Suzuki et al. | ................. | 385/14 |
| 6,477,286 B1 | 11/2002 | Ouchi | ..................... | 385/14 |
| 6,495,382 B2 | 12/2002 | Yap | ........................ | 438/24 |
| 6,512,864 B1 * | 1/2003 | Lin et al. | .................. | 385/24 |
| 6,718,079 B1 | 4/2004 | Gidon | .................... | 385/14 |
| 6,818,466 B2 | 11/2004 | Kornrumpf et al. | .......... | 385/14 |
| 2002/0150319 A1 * | 10/2002 | Antaki et al. | ............. | 385/14 |
| 2003/0012479 A1 * | 1/2003 | Kitou et al. | ............... | 385/14 |
| 2004/0146237 A1 * | 7/2004 | Taylor et al. | .............. | 385/14 |
| 2005/0111779 A1 * | 5/2005 | Joyner et al. | .............. | 385/14 |

OTHER PUBLICATIONS

"Integrated Circuit Packages," Brocure from Sony [retrieved on Oct. 27, 2006] Retrieved from the Internet: <URL:http://electronic-contract-manufacturing.globalspec.com/Industrial-Directory/ic_packaging> (15 pages).

* cited by examiner

*Primary Examiner*—Michelle Connelly-Cushwa
*Assistant Examiner*—Chris Chu

(57) ABSTRACT

An optoelectronic integrated circuit (OEIC) having an optical core coupled to first and second interface circuits. The first interface circuit is adapted to convert an electrical input signal into an optical signal; the optical core is adapted to process the optical signal in the optical domain; and the second interface circuit is adapted to convert the processed optical signal into an electrical output signal. In one embodiment, an OEIC of the invention is fabricated using a single wafer, has only electrical inputs/outputs, does not have any external optical interfaces, and is not adapted to receive any external optical signals. Advantageously, due to the signal processing being in the optical domain, a circuit of the invention carries out its functionality, with little or no performance degradation, over a relatively wide frequency range. In addition, this circuit has a relatively small size and can be relatively inexpensive.

20 Claims, 2 Drawing Sheets

INTEGRATED CIRCUIT HAVING AN OPTICAL CORE

BACKGROUND OF THE INVENTION

1. Field of the Invention

The present invention relates to integrated circuits.

2. Description of the Related Art

For various high-speed electronics applications, it is often desirable to have a circuit, which carries out its functionality, with little or no performance degradation, over a relatively wide frequency range, e.g., from dc to about 40 GHz. However, broadband microwave circuits with such characteristics are inherently difficult to design and manufacture. As a result, certain broadband circuits (e.g., tunable delay lines and variable attenuators) are still sometimes implemented using old-fashioned electro-mechanical assemblies. Disadvantageously, these electromechanical assemblies might cause a circuit to have a relatively large size, suffer from reliability problems, have a relatively low tuning speed, and/or be relatively expensive to manufacture and maintain.

SUMMARY OF THE INVENTION

Problems in the prior art are addressed, in accordance with the principles of the present invention, by an optoelectronic integrated circuit (OEIC) having an optical core coupled to first and second interface circuits. The first interface circuit is adapted to convert an electrical input signal into an optical signal; the optical core is adapted to process the optical signal in the optical domain; and the second interface circuit is adapted to convert the processed optical signal into an electrical output signal. In one embodiment, an OEIC of the invention is fabricated using a single wafer, has only electrical inputs/outputs, does not have any external optical interfaces, and is not adapted to receive any external optical signals. Advantageously, due to the signal processing being in the optical domain, a circuit of the invention carries out its functionality, with little or no performance degradation, over a relatively wide frequency range. In addition, this circuit has a relatively small size and can be relatively inexpensive.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

At least some of the above-indicated problems flow from the fact that the percentage bandwidth (i.e., the ratio of the required bandwidth to the frequency of high-frequency cut-off) for a prior-art broadband circuit is relatively large, e.g., nearly 100%. In certain embodiments of the present invention, the percentage bandwidth is significantly reduced, e.g., to about 0.01%. As a result, a circuit designed in accordance with the principles of the present invention can carry out its functionality, with little or no performance degradation, over a relatively wide frequency range. In addition, this circuit has a relatively small size and can be relatively inexpensive.

Figure 1:
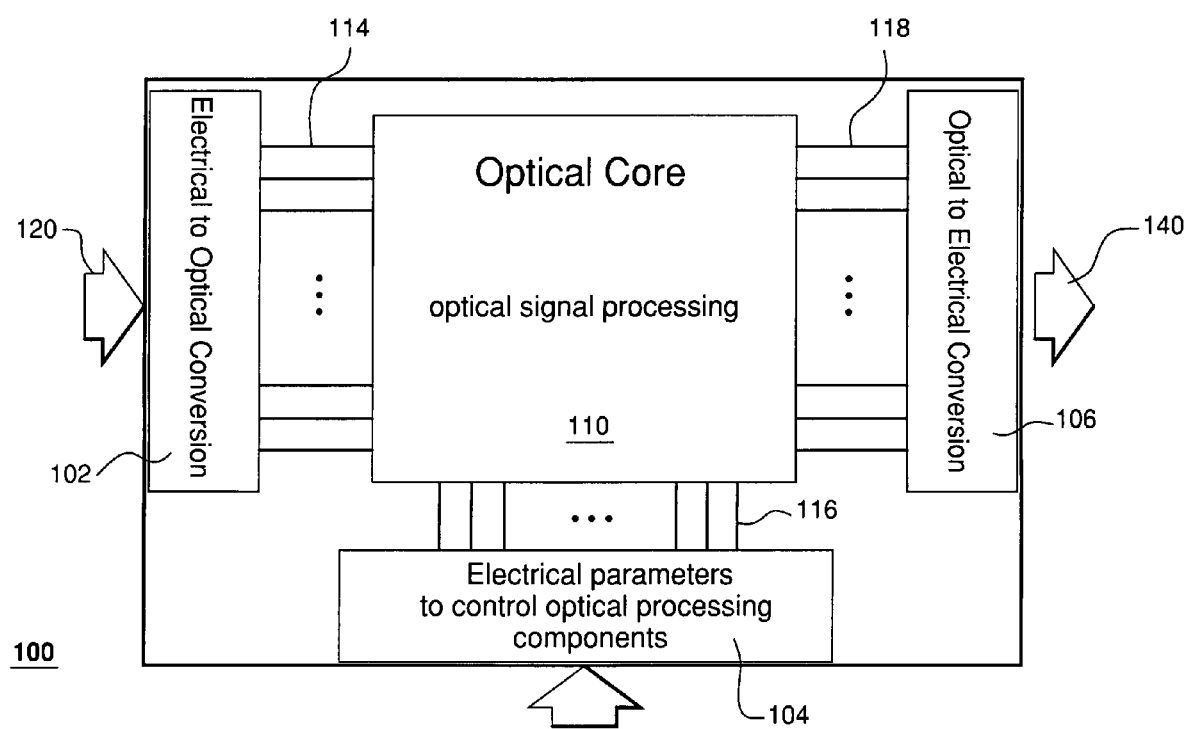
FIG. 1 shows a block diagram of an optoelectronic integrated circuit (OEIC) 100 according to one embodiment of the invention.

FIG. 1 shows a block diagram of an optoelectronic integrated circuit (OEIC) 100 according to one embodiment of the invention. OEIC 100 includes interface blocks (circuits) 102, 104, and 106 coupled to an optical core 110. Interface block 102 has one or more electrical-to-optical converters, e.g., integrated laser diodes, adapted to convert electrical signals 120 applied to the interface block into corresponding optical signals 114. Optical core 110 is a circuit block designed to appropriately process, in the optical domain, the optical signals received from interface block 102. As such, optical core 110 has suitable circuit elements, e.g., one or more optical amplifiers, interferometers, wavelength converters, optical signal mixers, splitters, and combiners, modulators, and the like, which work together to implement, in the optical domain, a desired processing function. Operation of some or all of the circuit elements in optical core 110 is controlled with electrical control signals 116 generated by and/or provided via interface block 104. Processed optical signals 118 are applied to interface block 106, which has one or more optical-to-electrical converters, e.g., integrated photodiodes, adapted to convert these optical signals into corresponding electrical signals 140 and output these electrical signals from OEIC 100.

The electrical-to-optical conversion performed in interface block 102 up-shifts an input signal from (e.g., a low-pass band in) a low-frequency range to (e.g., a pass band in) an optical-frequency range, thereby significantly reducing the percentage bandwidth for the signal processing carried out in optical core 110. For example, when a wavelength produced by interface block 102 is about 1.5 μm and the input signal bandwidth is about 40 GHz (e.g., from dc to about 40 GHz), the percentage bandwidth in the optical domain is only about 0.02%. With the percentage bandwidth this low, signal processing having relatively uniform characteristics across the entire signal bandwidth is obtained relatively easily in optical core 110, thereby circumventing the technical difficulties of prior-art techniques. The optical-to-electrical conversion performed in interface block 106 downshifts the processed optical signal from the optical-frequency range back to the low-frequency range.

In one embodiment, OEIC 100 is fabricated using a single wafer (die), has only electrical inputs/outputs, does not have any external optical interfaces, and is not adapted to receive any external optical signals. Hence, to an external user, OEIC 100 looks substantially similar to a purely electrical integrated circuit (IC) or chip. Consequently, a system having OEIC 100 can be assembled using standard techniques developed for handling electrical IC chips, without incurring the cost normally associated with the use of special optical packaging techniques developed for circuits/devices having external optical interfaces. In addition, the absence of such external optical interfaces makes the system relatively robust against vibration and/or shock.

Figure 2:
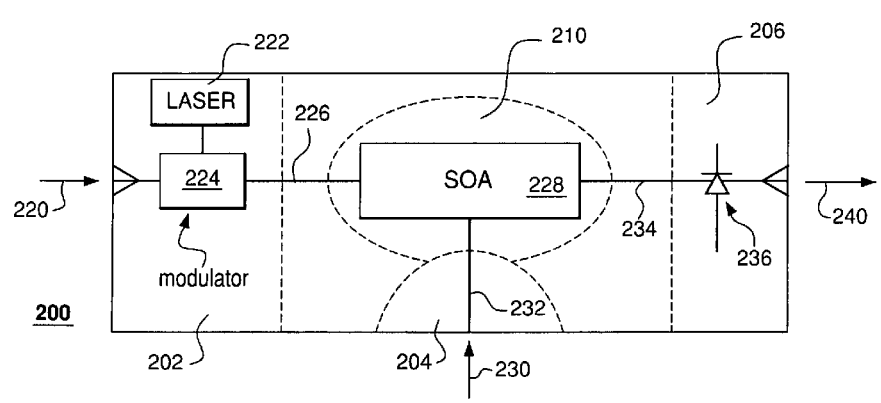
FIG. 2 shows a block diagram of an OEIC that implements a variable-gain wideband amplifier according to one embodiment of the invention.

FIG. 2 shows a block diagram of an OEIC 200, which implements a variable-gain wideband amplifier according to one embodiment of the invention. OEIC 200 has an integrated laser diode 222 coupled to a modulator 224. Laser diode 222 generates a continuous-wave (CW) beam of light, which is intensity- and/or phase-modulated in modulator 224 based on an electrical input signal 220 applied to OEIC 200. In one embodiment, modulator 224 is a Mach-Zehnder modulator. The modulated optical signal is then applied via a waveguide 226 to a solid-state optical amplifier (SOA) 228, the gain of which is controlled by an electrical gain-control signal 230. SOA 228 optically amplifies the signal received via waveguide 226 and applies the amplified signal via a waveguide 234 to an integrated photodiode 236. Photodiode 236 converts the amplified signal into a corresponding electrical output signal 240.

Laser diode 222 and modulator 224 are parts of an interface block 202, which is analogous to interface block 102 of OEIC 100. Similarly, photodiode 236 is a part of an interface block 206, which is analogous to interface block 106 of OEIC 100. A contact line (e.g., bus) 232, which delivers gain-control signal 230 to SOA 228, is a part of an interface block 204, which is analogous to interface block 104 of OEIC 100. SOA 228 is a part of an optical core 210, which is analogous to optical core 110 of OEIC 100.

As known in the art, SOA 228 is capable of providing a relatively flat gain profile over a relatively wide bandwidth, e.g., about 100 GHz, in the optical frequency range. As a result, OEIC 200 has a corresponding relatively flat gain profile in the low-frequency range, e.g., from dc to about 100 GHz. In addition, when SOA 228 is turned off, it provides excellent isolation (transmits substantially no light) between waveguides 226 and 234, thereby significantly reducing detrimental effects of parasitic RF coupling between the input and output ports often present in prior-art variable-gain wideband amplifiers operating in the electrical domain. One skilled in the art will also understand that SOA 228 can be configured to have a gain value smaller than one, thereby enabling OEIC 200 to function as an attenuator.

Figure 3:
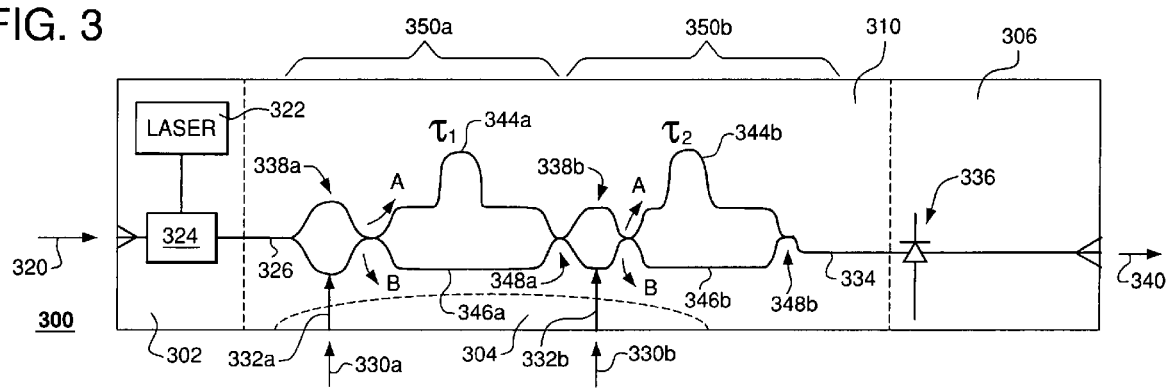
FIG. 3 shows a block diagram of an OEIC that implements a wideband tunable delay line according to one embodiment of the invention.

FIG. 3 shows a block diagram of an OEIC 300, which implements a wideband tunable delay line according to one embodiment of the invention. OEIC 300 has an integrated laser diode 322 coupled to a modulator 324, which are similar to integrated laser diode 222 and modulator 224 of OEIC 200. Laser diode 322 generates a CW beam of light, which is modulated in modulator 324 based on an electrical input signal 320 applied to OEIC 300. The modulated optical signal is then applied via a waveguide 326 to an optical core 310 having two cascaded delay units 350a–b controlled by electrical control signals 330a–b, respectively. Based on control signals 330a–b, delay units 350a–b can route the optical signal from waveguide 326 to a waveguide 334 along four different paths, each path having a different propagation length and, therefore, a different propagation-time delay. Waveguide 334 then delivers the optical signal to an integrated photodiode 336, which converts that signal into an electrical output signal 340.

Each delay unit 350 includes an optical switch 338, which has an input port and two output ports (labeled A and B) in FIG. 3. Each delay unit 350 further includes two waveguides 344 and 346 having different lengths and coupled to output ports A and B, respectively. The ends of waveguides 344 and 346 are coupled together at a coupler 348. Coupler 348a of delay unit 350a is connected to the input port of switch 338b of delay unit 350b, and coupler 348b of delay unit 350b is connected to waveguide 334.

Based on control signal 330, switch 338 routes an optical signal applied to its input port to one of its output ports. For example, when control signal 330 is a binary "zero", switch 338 directs the optical signal from its input port to output port B. Alternatively, when control signal 330 is a binary "one", switch 338 directs the optical signal from the input port to output port A. Therefore, en route from waveguide 326 to waveguide 334, the optical signal can propagate along a path having one of the following waveguide combinations: (1) waveguides 346a and 346b, (2) waveguides 344a and 346b, (3) waveguides 346a and 344b, and (4) waveguides 344a and 344b, which combinations provide four delay states for OEIC 300. Taking as a reference the propagation-time delay accumulated in the path having waveguide combination (1), the following represent the relative propagation-time delays accumulated in the paths having waveguide combinations (2) through (4): (2) $\tau 1$, (3) $\tau 2$, and (4) $\tau 1+\tau 2$, where $\tau 1$ denotes the relative propagation-time delay for waveguides 344a and 346a in delay unit 350a, and $\tau 2$ denotes the relative propagation-time delay for waveguides 344b and 346b in delay unit 350b.

In one embodiment, the values of $\tau 1$ and $\tau 2$ are selected such that $\tau 1 \approx \tau 2/2$. Consequently, the delay values available in this embodiment can be represented as $M \times \tau 1$, where M is a two-bit multiplier and control signals 330a–b provide the least significant bit and the most significant bit of the multiplier, respectively. One skilled in the art will appreciate that the cascaded arrangement of two delay units 350 in OEIC 300 can be extended to form a cascaded arrangement of N delay units 350, in which the relative propagation-time delay for waveguides 344 and 346 doubles from one delay unit to the next (downstream) delay unit, i.e., the relative propagation-time delay values form a geometric progression with a common ratio of about two. This extended cascaded arrangement can be used to implement a delay line, for which multiplier M is an N-bit multiplier and each control signal 330 provides a corresponding multiplier bit. However, in an alternative embodiment, delay units in a cascaded arrangement can be arranged in an arbitrary order (e.g., other than the order of increasing (or decreasing) relative propagation-time delay values) and/or the relative propagation-time delay values can form a geometric progression having a common ratio other than two.

Laser diode 322 and modulator 324 are parts of an interface block 302, which is analogous to interface block 102 of OEIC 100. Similarly, photodiode 336 is a part of an interface block 306, which is analogous to interface block 106 of OEIC 100. Contact lines 332a–b, which deliver control signals 330a–b to delay units 350a–b, are parts of an interface block 304, which is analogous to interface block 104 of OEIC 100. Delay units 350a–b are parts of an optical core 310, which is analogous to optical core 110 of OEIC 100.

Different monolithic or hybrid integration techniques can be used to fabricate optoelectronic integrated circuits of the invention. For example, U.S. Pat. No. 5,065,207 discloses a fabrication technique for a monolithically integrated OEIC having an SOA; U.S. Pat. No. 5,357,121 discloses a fabrication technique for an OEIC having a light-responsive element (e.g., an integrated photodiode); U.S. Pat. No. 5,589,404 discloses a fabrication technique for an OEIC having a multi-quantum well (MQW) modulator; U.S. Pat. No. 5,674,778 discloses a fabrication technique for an OEIC having monolithically integrated high-speed transistors, lasers, and photo-detectors; U.S. Pat. No. 5,721,750 discloses a fabrication technique for an OEIC having a laser diode; U.S. Pat. No. 6,391,214 discloses a fabrication technique for an OEIC having a laser diode and a modulator coupled to an integrated waveguide structure; and U.S. Pat. No. 6,818,466 discloses a fabrication technique for an OEIC having an integrated Mach-Zehnder modulator. The teachings of all these patents are incorporated herein by reference. Circuits of the invention may be fabricated using layered wafers. Additional layers of material may be deposited onto a wafer using, e.g., chemical vapor deposition. Various parts of the circuits may be mapped onto the corresponding layers using lithography. Different materials can be used for the layers. For example, an InP/InGaAsP/InGaAlAs layering scheme can be used as known in the art. Other appropriate (e.g., Si-based) layering schemes can similarly be used as well. Various structures may be modified, e.g., by metal deposition for enhanced reflectivity and/or electrical conductivity or by ion implantation for enhanced mechanical strength.

While this invention has been described with reference to illustrative embodiments, this description is not intended to be construed in a limiting sense. For example, various optical processing functions can be implemented in various embodiments of optical core 110 without departing from the scope and principles of the invention. The optical processing functions can be based on any suitable linear and/or non-liner optical effects including but not limited to harmonic generation, four-wave mixing, and cross-phase modulation. Electrical input, control, and/or output signals for OEIC 100 can be in any suitable (analog and/or digital) form. Various modifications of the described embodiments, as well as other embodiments of the invention, which are apparent to persons skilled in the art to which the invention pertains are deemed to lie within the principle and scope of the invention as expressed in the following claims.

What is claimed is:

1. An integrated circuit, comprising:
   a first interface circuit adapted to convert an electrical input signal into an optical signal;
   an optical core coupled to the first interface circuit and adapted to process the optical signal; and
   a second interface circuit coupled to the optical core and adapted to convert a processed optical signal into an electrical output signal, wherein:
      the integrated circuit is fabricated using a single wafer; and
      after the integrated circuit has been packaged, the integrated circuit is not adapted to receive external optical signals and is not adapted to output external optical signals.

2. The invention of claim 1, further comprising a third interface circuit coupled to the optical core and adapted to apply one or more electrical control signals to control the optical signal processing in the optical core.

3. The invention of claim 1, wherein the integrated circuit does not have external optical interfaces.

4. The invention of claim 1, wherein the integrated circuit has external interfaces, which are adapted to receive or output only electrical signals.

5. The invention of claim 1, wherein the first interface circuit comprises:
   a light source adapted to generate a beam of light; and
   a modulator optically coupled to the light source and adapted to modulate the beam of light based on the electrical input signal to generate the optical signal applied to the optical core.

6. The invention of claim 1, wherein the second interface circuit comprises a photodiode adapted to convert the processed optical signal into the electrical output signal.

7. The invention of claim 1, wherein the optical core comprises an optical amplifier adapted to amplify the optical signal received from the first interface circuit to generate the processed optical signal.

8. The invention of claim 1, wherein the optical core comprises one or more serially connected delay units adapted to apply a selected propagation-time delay to the optical signal received from the first interface circuit to generate the processed optical signal.

9. The invention of claim 8, wherein each delay unit comprises:
   an optical switch having an input port and first and second output ports;
   a first waveguide coupled to the first output port;
   a second waveguide coupled to the second output port; and
   an optical coupler, whereat the first and second waveguides are coupled together, wherein the delay unit is adapted to route an optical signal applied to the input port from said input port to the optical coupler via a selected one of the first and second waveguides.

10. The invention of claim 9, wherein:
   a length of the first waveguide between the first output port and the optical coupler is different from a length of the second waveguide between the second output port and the optical coupler; and
   said length difference defines a relative delay value for the delay unit.

11. The invention of claim 10, wherein:
   the optical core comprises a first delay unit and one or more serially connected downstream delay units; and
   the relative delay values for the first and downstream delay units form a geometric progression having a scale factor and a common ratio.

12. The invention of claim 11, wherein the common ratio is about 2.

13. The invention of claim 1, further comprising:
   a third interface circuit coupled to the optical core and adapted to apply one or more electrical control signals to control the optical signal processing in the optical core, wherein:
      the first interface circuit comprises:
         a light source adapted to generate a beam of light; and
         a modulator optically coupled to the light source and adapted to modulate the beam of light based on the electrical input signal to generate the optical signal applied to the optical core;
      the second interface circuit comprises a photodiode adapted to convert the processed optical signal into the electrical output signal; and
      the optical core comprises an optical amplifier adapted to amplify the optical signal received from the first interface circuit to generate the processed optical signal.

14. The invention of claim 1, further comprising:
   a third interface circuit coupled to the optical core and adapted to apply one or more electrical control signals to control the optical signal processing in the optical core, wherein:
      the first interface circuit comprises:
         a light source adapted to generate a beam of light; and a modulator optically coupled to the light source and adapted to modulate the beam of light based on the electrical input signal to generate the optical signal applied to the optical core;

the second interface circuit comprises a photodiode adapted to convert the processed optical signal into the electrical output signal; and the optical core comprises one or more serially connected delay units adapted to apply a selected propagation-time delay to the optical signal received from the first interface circuit to generate the processed optical signal.

15. A method of signal processing, comprising:

converting an electrical input signal into an optical signal using a first interface circuit;

processing the optical signal in an optical core coupled to the first interface circuit; and converting a processed optical signal into an electrical output signal using a second interface circuit coupled to the optical core, wherein:

the first and second interface circuits and the optical core are implemented in an integrated circuit, which is fabricated using a single wafer; and after the integrated circuit has been packaged, the integrated circuit is not adapted to receive external optical signals and is not adapted to output external optical signals.

16. The invention of claim 15, further comprising applying one or more electrical control signals to control the optical signal processing in the optical core using a third interface circuit coupled to the optical core.

17. The invention of claim 15, wherein the integrated circuit does not have external optical interfaces.

18. The invention of claim 15, wherein the integrated circuit has external interfaces, which are adapted to receive or output only electrical signals.

19. An integrated circuit, comprising:

a first interface circuit adapted to convert an electrical input signal into an optical signal;

an optical core coupled to the first interface circuit and adapted to process the optical signal; and a second interface circuit coupled to the optical core and adapted to convert a processed optical signal into an electrical output signal, wherein:

the optical core comprises one or more serially connected delay units adapted to apply a selected propagation-time delay to the optical signal received from the first interface circuit to generate the processed optical signal;

each delay unit comprises:

an optical switch having an input port and first and second output ports;

a first waveguide coupled to the first output port;

a second waveguide coupled to the second output port; and an optical coupler, whereat the first and second waveguides are coupled together, wherein the delay unit is adapted to route an optical signal applied to the input port from said input port to the optical coupler via a selected one of the first and second waveguides, wherein:

a length of the first waveguide between the first output port and the optical coupler is different from a length of the second waveguide between the second output port and the optical coupler; and said length difference defines a relative delay value for the delay unit;

the optical core comprises a first delay unit and one or more serially connected downstream delay units; and the relative delay values for the first and downstream delay units form a geometric progression having a scale factor and a common ratio.

20. The invention of claim 19, wherein the common ratio is about 2.

* * * * *